United States Patent [19]

Bernard

[11] Patent Number: 4,901,010
[45] Date of Patent: Feb. 13, 1990

[54] CURRENT-MEASURING DEVICE
[75] Inventor: Landre Bernard, Paris, France
[73] Assignee: Universal Technic, Paris, France
[21] Appl. No.: 338,050
[22] Filed: Apr. 13, 1989

Related U.S. Application Data

[62] Division of Ser. No. 82,543, Aug. 7, 1987, Pat. No. 4,841,237.

[30] Foreign Application Priority Data

Aug. 11, 1986 [FR] France ............................ 86 11586

[51] Int. Cl.⁴ ...................... G01R 11/02; G01R 11/04
[52] U.S. Cl. ................................ 324/127; 324/117 R; 324/129
[58] Field of Search ................... 324/127, 129, 117 R; 336/212

[56] References Cited

U.S. PATENT DOCUMENTS 2,146,555  2/1939  Arey .................................... 324/129
4,620,151 10/1986  Landre ................................ 324/127

FOREIGN PATENT DOCUMENTS 2538556  6/1984  France ................................ 324/127

Primary Examiner—Reinhard J. Eisenzopf
Assistant Examiner—W. Burns
Attorney, Agent, or Firm—Sixbey, Friedman, Leedom & Ferguson

[57] ABSTRACT

A current-measuring device in accordance with the invention comprises an annular magnetic circuit having separate first and second magnetic circuit portions (1, 2) with ends suitable for coming face-to-face to form a closed magnetic circuit, a housing (5) surrounding at least the first portion (1) of the magnetic circuit the first portion being slidably mounted within the housing, magnetic flux detection means (12) for detecting a magnetic flux in the magnetic circuit; the housing includes a bearing member against which the second portion of magnetic is firmly held when slided with the first portion from a position where the second portion does not face the bearing member to a position where the second portion faces the bearing member.

5 Claims, 2 Drawing Sheets

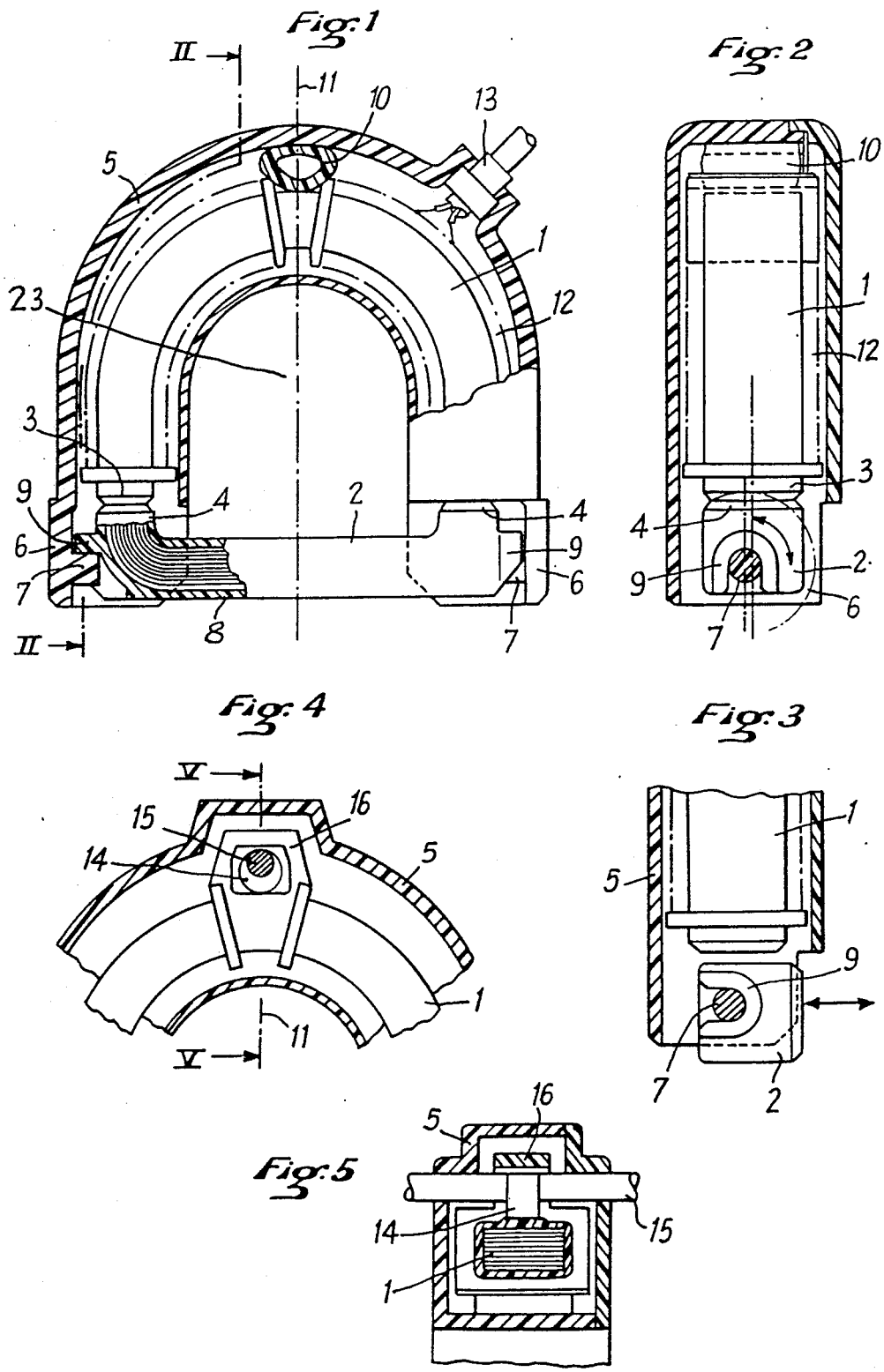

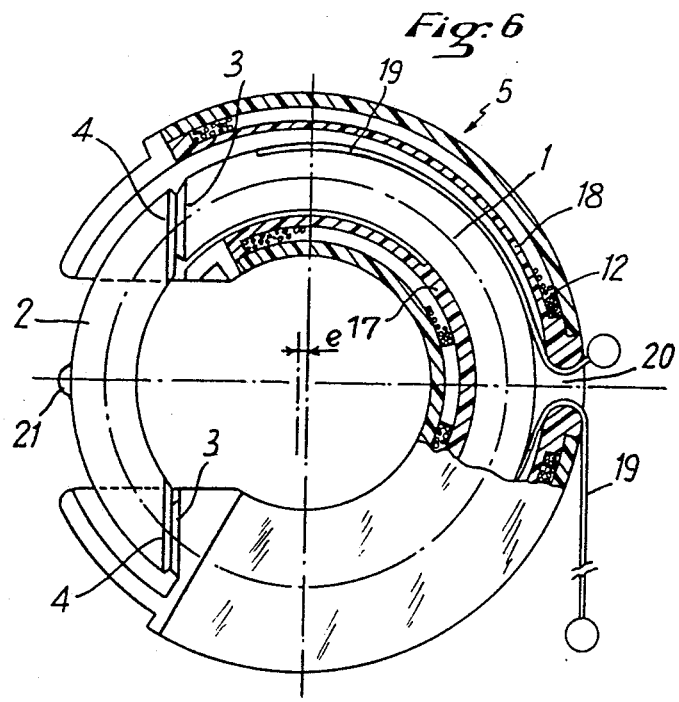
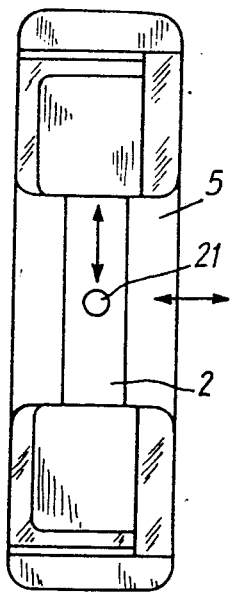
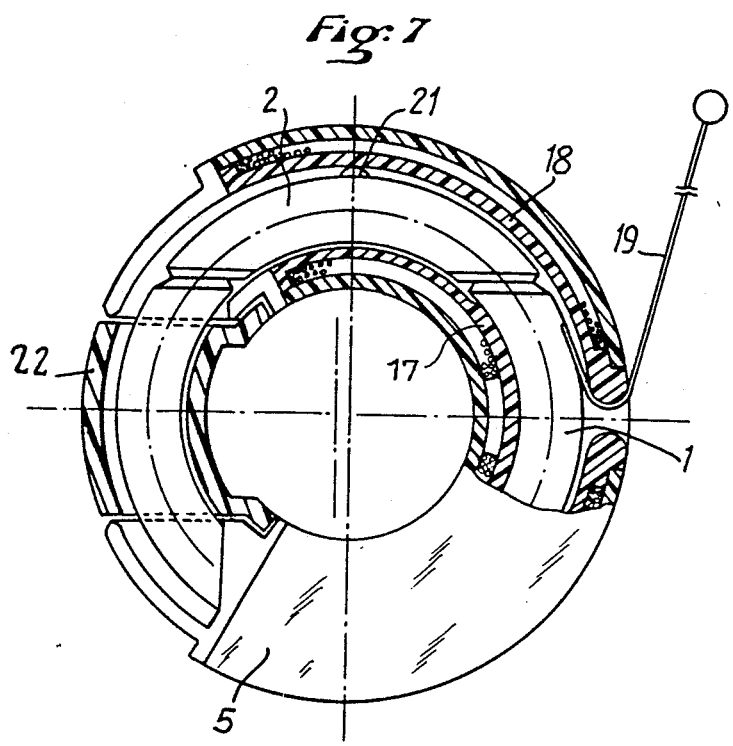

CURRENT-MEASURING DEVICE

This is a Divisional application of Ser. No. 07/082,543 filed Aug. 7, 1987, and issued 6/20/89 as U.S. Pat. No. 4,841,237.

The present invention relates to an openable device for measuring current, and more particularly a current transformer for installation on a permanent or a semi-permanent basis.

BACKGROUND OF THE INVENTION

Numerous types of openable current-measuring devices are known. The commonest type is a current-measuring clamp which is put into position to measure the current flowing in a cable at a given moment and is then removed after the measurement has been performed. When the current flowing along a conductor is to be measured on a permanent or on a semi-permanent basis, it is generally not desirable to use a current-measuring clamp. The opening magnetic circuit of such a clamp is generally closed by a resilient member such as a spring, and under conditions of continuous use the clamp runs the risk of opening under the effect of the vibrations to which it is subject. Further, a current-measuring clamp is generally fitted with handles whose bulk is incompatible with the requirements of complex electrical installations.

When a current transformer is to be installed on a permanent or a semi-permanent basis, it generally comprises a magnetic circuit comprising two portions which are hinged to each other like a clamp and which are held clamped against each other by a bolt which extends perpendicularly to the end faces of the magnetic circuit portions. Such devices are difficult to manipulate because of the large amount of room that they occupy when in the open position. Further, it is generally difficult to control the clamping force applied by the bolts and the bearing surfaces may become distorted, thereby disturbing the transmission of magnetic flux through the gaps between the portions of the magnetic circuit.

Preferred embodiments of the present invention provide a current measuring device which is simple in structure, which is easy to put into place, and which provides good transmission for magnetic flux.

SUMMARY OF THE INVENTION

The present invention provides a current-measuring device comprising an annular magnetic circuit having separate first and second magnetic circuit portions with ends suitable for coming face-to-face to form a closed magnetic circuit, a housing surrounding at least the first portion of the magnetic circuit, magnetic flux detection means for detecting a magnetic flux in the magnetic circuit, and locking means for locking the two magnetic circuit portions against each other, wherein the locking means comprise a bearing member carried by the housing and pivot means enabling at least one of the magnetic circuit portions to pivot relative to the housing, in such a manner that during pivoting the second magnetic portion comes into contact with the bearing member and is firmly held against the first magnetic circuit portion thereby.

Thus, the current-measuring device is locked in its operating position merely by pivoting. Further, the room occupied by the current-measuring device remains the same throughout the operation of installing it.

In a preferred embodiment of the invention, the housing includes fastening portions extending beyond the ends of the first magnetic circuit portion on respective outer sides thereof, and in that the second magnetic circuit portion is mounted to pivot relative to the fastening portions between a first position in which the ends of the second magnetic circuit portion are not face-to-face with the ends of the first magnetic circuit portion and where the second magnetic circuit portion is laterally displacable for the purpose of disengaging from the pivot means, and a second position where the second magnetic circuit portion has its ends pressed against the ends of the first magnetic circuit portion and where the second magnetic circuit portion is immobilized, the device further including means to enable the ends of the first magnetic circuit portion to move relative to the pivot means. Thus, the current-measuring device is simply closed by engaging the second magnetic circuit portion sideways against the pivot means, and then in pivoting it about itself so as to bring its ends face-to-face with the ends of the first magnetic circuit portion.

According to an advantageous aspect of this embodiment, the means for enabling the ends of the first magnetic circuit portion to move relative to the pivot means comprise at least one resilient member disposed between the housing and the first magnetic circuit portion at a point opposite to the ends of the first magnetic circuit portion in such a manner as to exert a substantially identical force on each of the ends of the first magnetic circuit portion. Thus, the first magnetic circuit portion is permanently urged towards the second magnetic circuit portion without deforming the surfaces of the gaps therebetween.

According to another advantageous aspect of this embodiment of the invention, the means for enabling the ends of the first magnetic circuit portion to move relative to the pivot means comprise a cam disposed on a shaft between the housing and the first magnetic circuit portion at a point opposite to the ends of the first magnetic circuit portion so as to exert substantially identical forces on each of the ends of the first magnetic circuit portion. Thus, the pressure with which the surfaces of the gaps are pressed together is accurately controlled without setting up deformations therebetween.

According to another advantageous embodiment of the invention, the housing includes a guide surface in contact with the first magnetic circuit portion over a portion of its periphery, and in that the magnetic circuit portions are mounted to pivot with a sliding motion relative to the guide surface. Preferably, the device includes drive means for driving the first magnetic circuit portion. Thus, after placing the ends of the second magnetic circuit portion face-to-face with the ends of the first magnetic circuit portion, the entire magnetic circuit is easily moved to its locking position by acting on the first magnetic circuit portion.

BRIEF DESCRIPTION OF THE DRAWINGS

Embodiments of the invention are described by way of example with reference to the accompanying drawings, in which:

FIG. 1 is a partially cutaway elevation view of a first embodiment of the invention;

FIG. 2 is a section view on line II—II of FIG. 1;

FIG. 3 is a fragmentary section similar to FIG. 2 showing the device in a different position;

FIG. 4 is a cutaway elevation view of a fragment of a variant of the FIG. 1 embodiment;

FIG. 5 is a section on line V—V of FIG. 4;

FIG. 6 is a partially cutaway elevation view of a second embodiment of the invention;

FIG. 7 is a view similar to FIG. 6 showing the device in a different position; and FIG. 8 is a front elevation view of the FIG. 6 device.

DESCRIPTION OF PREFERRED EMBODIMENTS

With reference to FIGS. 1 to 3, the first embodiment of a current-measuring device in accordance with the invention comprises an annular magnetic circuit having a first magnetic circuit portion 1 and a separate second magnetic circuit portion 2. The first magnetic circuit portion 1 is U-shaped and has ends 3. The second magnetic circuit portion 2 is also U-shaped, with very short side arms and includes ends 4 at the same spacing as the ends 3 of the first magnetic circuit portion, such that the ends 3 and 4 are suitable for being brought face-to-face to constitute a closed magnetic circuit.

A housing 5 surrounds the first magnetic circuit portion and includes fastening portions 6 extending beyond the ends of the first magnetic portion 1 on the outer sides thereof. Inside the fastening portions 6, the housing includes pivot pegs 7 projecting inwardly into the housing.

The second magnetic circuit portion 2 is enclosed in a sheath 8 which also provides riders 9 near the corners of the second magnetic circuit portion and suitable for engaging on the pivot pegs 7.

The first magnetic circuit portion 1 is movably mounted in the housing 5 and is urged towards the fastening portions 6 by a resilient member 10, e.g. a piece of rubber tube, disposed between the housing 5 and the first magnetic circuit portion at a point opposite to the ends 3 of the first magnetic circuit portion. In the embodiment shown, the resilient member 10 is disposed on the axis of symmetry 11 of the first magnetic circuit portion and thus transmits identical force to each of the ends 3 of the first magnetic circuit portion.

In conventional manner, the device includes means for detecting magnetic flux in the magnetic circuit, said means being constituted in this case by a winding 12 symbolized in the figures by dot-dashed lines, with the ends of the winding being connected to a terminal 13 for transmitting the resulting electromagnetic signal to measuring apparatus.

The measuring device in accordance with the invention is put into place as follows: the second magnetic circuit portion is removed and the first magnetic circuit portion 1 is engaged about a conductor so that the conductor occupies the central space 23 therein. The second magnetic circuit portion 2 is then engaged sideways as shown in FIG. 3 with the riders 9 engaging the pivot pegs 7. In this first position, the ends 4 of the second magnetic circuit portion 2 are not facing the ends 3 of the first magnetic circuit portion 1, and the second magnetic circuit portion 2 can still be removed sideways to disengage from the pivot means. Starting from this first position, the second magnetic circuit portion 2 is pivoted about the axis of the pegs 7 as indicated by the arrow in FIG. 2 to bring it into a second position where its ends 4 are pressed against the ends 3 of the first magnetic circuit portion. During the pivoting movement of the second magnetic circuit portion 2, the first magnetic circuit portion 1 is pushed away against the force exerted by the resilient member 10 until the ends 4 of the second magnetic circuit portion are pressed against the ends 3 of the first magnetic circuit portion. It can thus be seen that the resilient member 10 constitutes means enabling the ends of the first magnetic circuit portion to move relative to the pivot means, and that the pivot pegs 7 constite a bearing member which is carried by the housing and which serves to hold the second magnetic circuit portion against the first magnetic circuit portion.

FIGS. 4 and 5 show a variant embodiment in which the resilient member 10 is replaced by a cam 14 disposed on a shaft 15 between the housing 5 and the first magnetic circuit portion 1, said shaft lying substantially on the axis of symmetry 11 of the first magnetic circuit portion 1. The cam 14 is surrounded by a ring 16 which is fixed to the first magnetic circuit portion. The position of the cam 14 is controlled by rotating the shaft 15. When the second magnetic circuit portion 2 is put into position, the cam 14 is rotated so that its broadest portion pushes the ring 16 towards the rear of the housing. The first magnetic circuit portion 1 is thus retracted rearwardly and sufficient space is left between the ends 3 of the first magnetic circuit portion and the pivot pegs 7 to enable the second magnetic portion 2 to pivot freely. When the ends 4 of the second magnetic circuit portion 2 are facing the ends 3 of the first magnetic circuit portion, the cam 14 is rotated so that its broadest portion presses against the back of the first magnetic circuit portion 1, as shown in FIG. 4. In this position, the cam 14 transmits an identical force to each of the ends of the first magnetic circuit portion. It may be observed with this embodiment that it is possible to lock the measuring device in a closed position by preventing the shaft 15 from rotating. Such locking may be obtained, for example, by providing the shaft 15 and the housing 5 with laterally extending tongues which may be fixed together by lead sealing.

FIGS. 6 to 8 show a second embodiment of the invention. In this embodiment the magnetic circuit is in the form of a torus. The first magnetic circuit portion 1 is constituted by a C-shaped portion of a torus and the second magnetic circuit portion 2 is in the form of a complementary portion of a torus. The housing 5 includes an inner cylindrical wall 17 and an outer wall 18 which is also cylindrical, but which is offset relative to the inner wall 17 by an eccentricity e. The diameter of the inner wall 17 is close to that of the inside face of the first magnetic circuit portion such that the inner wall 17 constitutes a guide surface coming into contact with the first magnetic circuit portion over a part of its periphery. The magnetic circuit portions are mounted to pivot with a sliding motion relative to the inner wall 17. The housing 5 is itself C-shaped and the outer wall 18 thus surrounds the outside of the first magnetic circuit portion. The device also includes drive means for the first magnetic circuit portion. These drive means are constituted by tapes 19 fixed to corresponding ends of the periphey of the first magnetic circuit portion and leaving the housing via a slot 20 in the outer wall 18 of the housing.

The second magnetic circuit portion 2 includes an outwardly projecting bearing stud 21.

In order to put this second embodiment into operation, the first magnetic circuit portion 1 is initially displaced by acting on one of the tapes 19 so that it occupies a symmetrical position relative to the opening in the housing as shown in FIG. 6. In this position, the second magnetic circuit portion 2 is engaged sideways so that its ends 4 come face-to-face with the ends 3 of the first magnetic circuit portion. One of the tapes 19 is then pulled to pivot the magnetic circuit assembly about its axis. During this movement, the second magnetic circuit portion enters the housing and, by virtue of the wall 18 being eccentric relative to the wall 17, the stud 21 presses progressively harder against the wall 18 so that the second magnetic circuit portion 2 is held firmly against the first magnetic circuit portion 1. As in the preceding embodiment, the device may be put into place in a tamper-proof manner by eliminating one of the two drive tapes 19 and by placing a sleeve 22 (FIG. 7) around the second magnetic circuit portion 2 prior to engaging it with the first magnetic circuit portion, with the ends of the sleeve 22 coinciding with the ends of the housing 5. When traction is applied to the remaining tape 19, the magnetic circuit assembly pivots about its axis to occupy the position shown in FIG. 7, and the sleeve is thus trapped between the ends of the housing 5. In this position it is no longer possible to gain access to the first magnetic circuit portion and the device is thus locked in a tamper-proof manner.

Naturally, the invention is not limited to the embodiments described above, and variant embodiments may be applied thereto without going beyond the scope of the invention. In particular, in the first embodiment, the pivot pegs need not be made on the fastening portions 6, but could be provided on the second magnetic circuit portion 2, in which case the pivot pegs should be engaged in slots provided in the fastening portions 6 extending perpendicularly to the plane of the first circuit portion 1. Likewise, the single resilient member 10 could be replaced by a plurality of separate resilient members disposed symmetrically relative to the first magnetic circuit portion.

In the second embodiment, instead of the walls 17 and 18 being eccentrically disposed, a tapering groove could be provided in the wall 18 in the vicinity of the opening in the housing. It would also be possible to provide an elliptically shaped magnetic circuit disposed between cylindrical walls, with the second magnetic circuit portion then being a portion of an ellipse cut out in the vicinity of one of the ends of the long axis of the ellipse.

I claim:

1. A current-measuring device comprising an annular magnetic circuit having separate first and second magnetic circuit portions with ends suitable for coming face-to-face to form a closed magnetic circuit, a housing surrounding at least the first portion of the magnetic circuit, said first portion being slidably mounted within said housing, magnetic flux detection means for detecting a magnetic flux in the magnetic circuit, wherein said housing includes a bearing member against which said second portion of the magnetic circuit is firmly held when slided with said first portion from a position where said second portion does not face said bearing member to a position where said second portion faces said bearing member.

2. A current-measuring device according to claim 1, including drive means for driving the first magnetic circuit portion.

3. A current-measuring device according to claim 2, wherein the housing is C-shaped and surrounds the first magnetic circuit portion around at least one outer side thereof and in that the drive means include tapes fixed to one end of the periphery of the first magnetic circuit portion and leaving the housing via a slot in the outside wall of the housing.

4. A current-measuring device according to claim 3, including a sleeve having ends which coincide with the ends of the housing.

5. A current-measuring device according to claim 1, wherein the second magnetic circuit portion includes a bearing stud projecting from a side turned towards the bearing member of the housing.

* * * * *